United States Patent
Ahn

[11] Patent Number: 5,977,623
[45] Date of Patent: Nov. 2, 1999

[54] SEMICONDUCTOR PACKAGE AND SOCKET THEREOF AND METHODS OF FABRICATING SAME

[75] Inventor: Young Jun Ahn, Daeku, Rep. of Korea

[73] Assignee: LG Semicon Co., Ltd., Cheongju, Rep. of Korea

[21] Appl. No.: 08/919,175

[22] Filed: Aug. 28, 1997

[30] Foreign Application Priority Data

Oct. 4, 1996 [KR] Rep. of Korea ...................... 96-43818

[51] Int. Cl.⁶ .......................... H01L 23/48; H01L 23/52; H01L 23/06
[52] U.S. Cl. .......................... 257/693; 257/704; 257/690; 257/698; 257/703
[58] Field of Search .................................... 257/691, 693, 257/704, 678, 690, 697, 701–703, 705, 684, 706, 722; 174/17 R, 58

[56] References Cited

U.S. PATENT DOCUMENTS

5,043,794  8/1991  Tai et al. .................................. 257/693

FOREIGN PATENT DOCUMENTS

| 62-123744 | 6/1987 | Japan | 257/698 |
| 2-58257 | 2/1990 | Japan | 257/700 |
| 3-101157 | 4/1991 | Japan | 257/696 |
| 4-105351 | 4/1992 | Japan | 257/700 |
| 5-243448 | 9/1993 | Japan | 257/696 |

*Primary Examiner*—Mahshid Saadat
*Assistant Examiner*—Jhihan B. Clark
*Attorney, Agent, or Firm*—Fleshner & Kim

[57] ABSTRACT

A semiconductor package and a socket thereof that are easily adaptable to a multiple pin structure includes a nonconductive base layer, a plurality of conductive metallic leads that extend vertically through the base layer, a wiring layer in which a pattern of fine metallic wires are formed to electrically couple to the conductive metallic leads to a semiconductor chip mounted in the package, a recess formed in the central portion of the wiring layer, and a cover for closing the upper portion of the recess. A semiconductor chip is mounted on the bottom portion of the recess, and conductive wires electrically couple the semiconductor chip to the fine metallic wires of the wiring layer. A socket for receiving the semiconductor package includes a socket body, a first plurality of socket pins arranged to couple with leads on a bottom surface of a semiconductor chip package mounted in the socket, a second plurality of socket pins arranged to couple with leads on peripheral side surfaces of a semiconductor chip package mounted in the socket, and a hinged cover.

13 Claims, 4 Drawing Sheets

SEMICONDUCTOR PACKAGE AND SOCKET THEREOF AND METHODS OF FABRICATING SAME

BACKGROUND OF THE INVENTION

1. Field of the Invention

The present invention relates to a semiconductor package and a socket thereof for a semiconductor package having a multiple pin structure.

2. Background of the Related Art

Recently, semiconductor packages have been made lighter and smaller. Within a predetermined package size, the number of pins (or leads) for transferring electrical signals from a semiconductor chip to the outside of the package has been limited. One of the related art reduced size semiconductor packages is known as a ceramic leadless chip carrier (CLCC).

FIGS. 1A and 1B are a partial cross-sectional view and a bottom view, respectively, illustrating a related art CLCC semiconductor package. As shown in FIG. 1A, the CLCC includes a ceramic body 1. A semiconductor chip 2 is attached to an upper central portion of the body 1 by an adhesive material (not shown). A pattern of a first conductive material layer 3 extends outwardly from the outer portion of the semiconductor chip 2 along the upper portion of the ceramic body 1 to a lower lateral portion of the body 1. A first insulation layer 4 is formed on an upper surface of the first conductive material layer 3 on all but a portion of the conductive material layer pattern. A pattern of a second conductive material layer 5 is then formed on an upper surface of the first insulation layer 4. A second insulation layer 6 is formed on an upper surface of the second conductive material layer 5 on all but a predetermined portion of the second conductive material layer 5. The semiconductor chip 2 and the first and second conductive material layer patterns 3 and 5 are electrically connected by conductive wires 7. A lid 8 is formed on the upper surface of the second insulation layer 6 so as to protect the semiconductor chip 2 and the wires 7. As shown in FIG. 1B, contact grooves 9 are also formed in exterior peripheral surfaces of the package.

FIG. 2 is a partial cross-sectional view illustrating the CLCC semiconductor package of FIGS. 1A and 1B mounted in a related art socket. As shown therein, a plurality of socket lead pins 21 formed in a socket 20 are inserted into corresponding ones of the contact grooves 9 formed in the peripheral surfaces of the semiconductor package 10. The socket lead pins 21 serve to transmit electrical signals from the semiconductor chip 2 to the outside.

FIG. 3 is a partial cross-sectional view illustrating the CLCC semiconductor package of FIGS. 1A and 1B mounted directly on a printed circuit board (PCB). As shown therein, the conductive material layer 3 formed in the lower periphery of the semiconductor package 10 is electrically soldered to a circuit pattern 31 of the PCB 30. In the drawings, reference numerals 32 denote solder.

The conductive material layers 3 and 5, which form electrical contact points of the related art CLCC semiconductor package that are connectable to a PCB, are formed only on the peripheral surfaces of the body 1. For this reason, the number of electric paths leading away from the semiconductor package is restricted, and it is difficult to accommodate the increasing number of pins of newer semiconductor packages.

SUMMARY OF THE INVENTION

Accordingly, it is an object of the present invention to provide a semiconductor package and a socket thereof and method for fabricating same that overcome at least the problems encountered in the related art.

It is another object of the present invention to provide an improved semiconductor package and a socket thereof that can provide a greater number of electrical contact paths, and that is adaptable to a multiple pin structure.

To achieve the above objects in whole or in part, a semiconductor package embodying the invention includes a nonconductive horizontal base layer, a plurality of conductive metallic leads that extend vertically through the base layer, a wiring layer in which a pattern of fine metallic wires is formed to electrically connect to the conductive metallic leads of a chip, and a recess is formed in a central portion of the wiring layer. A semiconductor chip is mounted on a bottom portion of the recess, and conductive wires electrically couple the semiconductor chip to the fine metallic wires of the wiring layer. A cover for closing an upper portion of the recess is also attached to the device.

To achieve the above objects, a socket of a semiconductor package embodying the invention includes a socket body, a recess formed in an upper central portion of the socket body for receiving a semiconductor package therein, a plurality of first socket pins that extend vertically through a horizontal bottom portion of the body, the upper and lower ends thereof extending beyond upper and lower surfaces of a bottom portion of the socket body, a plurality of second socket pins that extend vertically through lateral walls of the socket body, the upper ends thereof extending into an interior of the recess, the lower ends thereof extending beyond the lower surface of the bottom portion of the socket body, and a socket cover for covering an upper portion of the recess.

To achieve the above objects, the method of forming a semiconductor package embodying the invention includes the steps of providing a nonconductive base layer; forming a plurality of conductive leads on the base layer, wherein the conductive leads pass through the base layer and extend above and below the upper and lower surfaces of the base layer; forming a wiring layer comprising a plurality of conductive paths on the base layer by successively laminating and etching conductive and non-conductive material layers on the base layer, wherein the conductive paths are coupled to corresponding ones of the plurality of conductive leads; mounting a semiconductor chip on the package; and attaching the conductive paths of the wiring layer to electrical leads of the semiconductor chip using a plurality of wires.

A method of making a semiconductor chip socket embodying the invention includes the steps of providing a socket body that includes a recess bounded by a floor and sidewalls; forming a plurality of first socket pins that extend through the floor of the socket body; and forming a plurality of second socket pins that extend through the sidewalls and into the recess, wherein lower portions of the second socket pins and the first socket pins extend below the floor of the socket body embodying the invention.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 4A:
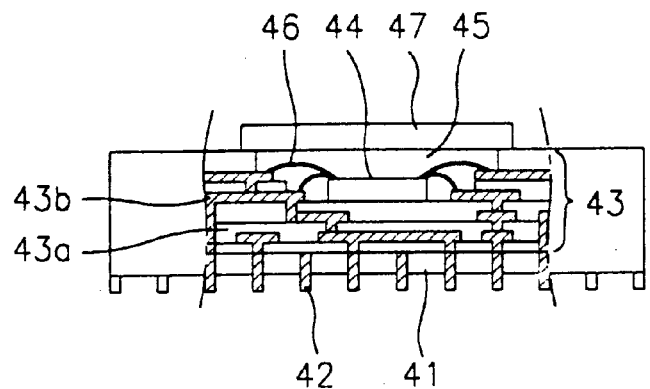
FIGS. 4A and 4B are a partial cross-sectional view, and a bottom view, respectively, illustrating a semiconductor package embodying the present invention.
Figure 4B:
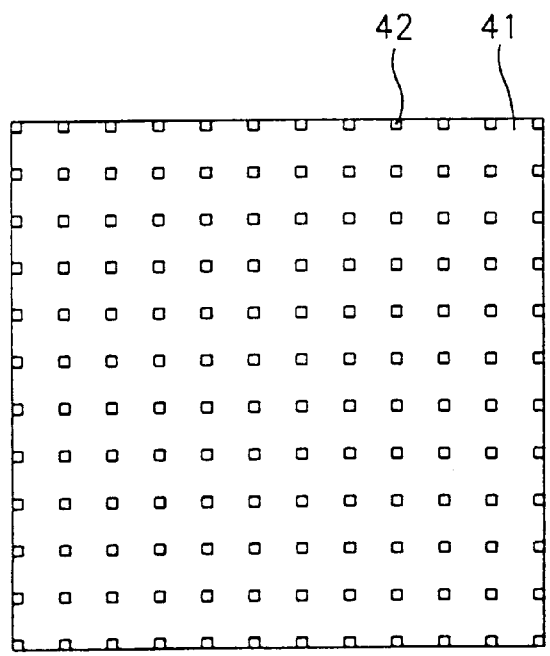

FIGS. 4A and 4B are a partial cross-sectional view, and a bottom view, respectively, illustrating a semiconductor package according to the present invention.

As shown therein, a semiconductor package embodying the invention includes a nonconductive base layer 41 made of a ceramic material. A plurality of conductive metallic leads 42 extend vertically through the base layer 41. The lower tip of each of the metallic leads 42, as shown in FIG. 4B, extends beyond the bottom surface of the base layer 41, so that the tips form a rectangular grid.

In addition, a wiring layer 43 is formed on the upper surface of the base layer 41. The wiring layer 43 comprises a plurality of fine metallic wires 43b, which are formed by repeatedly laminating and etching insulation layers 43a and conductive layers 43b. Some of the fine metallic wires 43b are electrically coupled to corresponding ones of the metallic leads 42.

A recess 45 is formed in the upper central portion of the wiring layer 43 for receiving a semiconductor chip 44 therein. The wiring layer 43 of the patterned fine metallic wires 43b is not formed in the central portion of the device, namely in the region where the recess 45 is formed.

A semiconductor chip 44 is mounted on the bottom portion of the recess 45, and the semiconductor chip 44 and the fine metallic wires 43a formed in the wiring layer 43 are electrically coupled by a plurality of conductive wires 46. A nonconductive cover 47 is fixedly attached to the upper portion of the wiring layer 43 and seals the recess 45, so that the semiconductor chip 44 and the wires 46 in the recess 45 can be protected.

Figure 5:
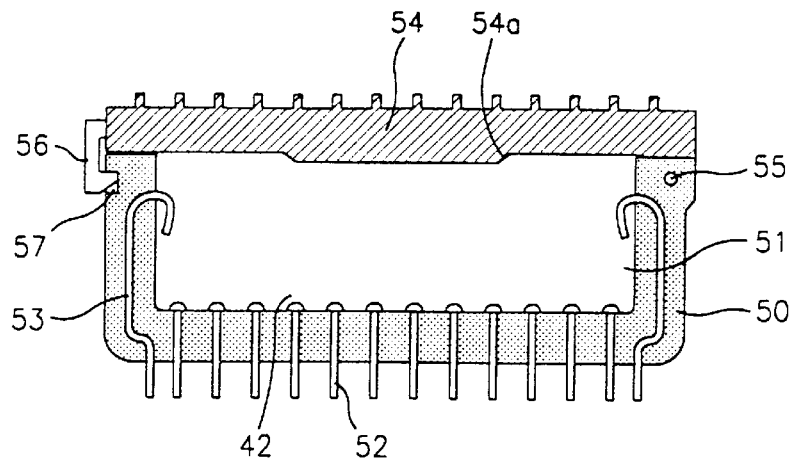
FIG. 5 is a cross-sectional view illustrating a socket for a semiconductor package embodying the present invention.

FIG. 5 is a cross-sectional view illustrating a socket for the semiconductor package shown in FIGS. 4A and 4B.

As shown therein, a socket embodying the invention includes a socket body 50. A recess 51 is formed in the upper central portion of the body 50 for receiving a semiconductor package 40 therein. First socket pins 52 are inserted into the bottom portion of the body 50 and extend upwardly and downwardly from the bottom portion of the socket body. Second socket pins 53 are vertically inserted into the lateral surface of the body 50. One end of the second socket pins 53 extends into the interior of the recess 51, and the other end extends downward beyond the lower surface of the body 50. The ends of the first and second socket pins 52 and 53 that extend into the interior of the recess 51 are elliptically bent in order to increase a contact surface thereof, so that when mounting the semiconductor package 40 in the recess 51, the first and second socket pins 52 and 53 can come into electrical contact with the conductive metallic leads 42.

In addition, a socket cover 54 is formed on the upper portion of the body 50 in order to close the recess 51. One side of the cover 54 is hinged to a hinge portion 55 of the body 50 to allow the cover 54 to open and close the recess 51. The underside of the cover 54 may include a central boss 54a for contacting and pressing the semiconductor package. A hook 56 can be formed at another side of the cover 54, and a hook recess 57 may be formed at a corresponding portion of the body 50, so that the hook 56 may be locked to the hook recess 57 when the socket cover 54 covers the recess 51. A plurality of parallel fins and grooves are formed on the upper surface of the cover 54 so as to more efficiently radiate heat from the cover 54.

Figure 6:
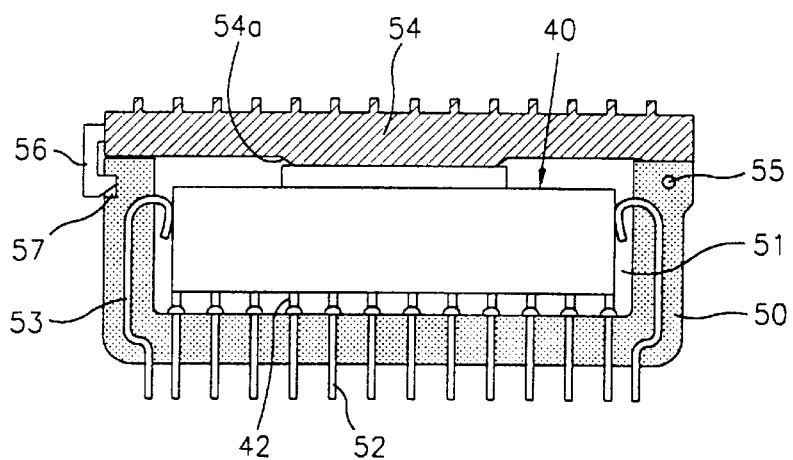
FIG. 6 is a partial cross-sectional view illustrating the semiconductor package of FIG. 4 mounted in the socket of FIG. 5 according to the present invention.

FIG. 6 is a cross-sectional view illustrating the semiconductor package of FIG. 4 mounted in the socket of FIG. 5 according to the present invention. As shown therein, the semiconductor package 40 is mounted in the recess 51 of the socket, and the cover 54 of the socket is closed. The hook 56 of the cover 54 is locked to the hook recess 57 of the body 50, so that the cover 54 is tightly fixed to the body 50. In addition, the boss 54a on the lower surface of the cover 54 pushes down on the upper surface of the semiconductor package 40, so that the first socket pins 52 protruding up from the bottom portion of the recess 51 and the metallic leads 42 formed in the semiconductor package 40 are electrically coupled.

Figure 1A:
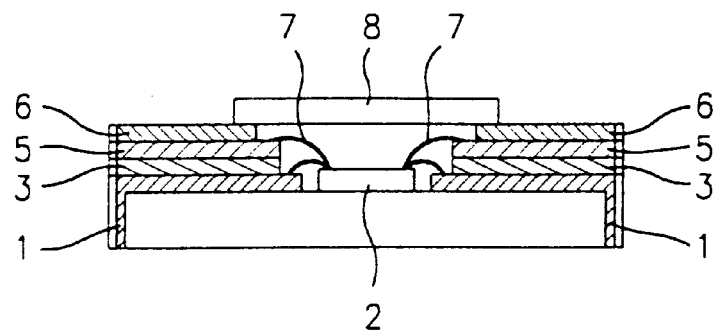
FIGS. 1A and 1B are a partial cross-sectional view, and a bottom view, respectively, illustrating a related art CLCC semiconductor package.
Figure 1B:
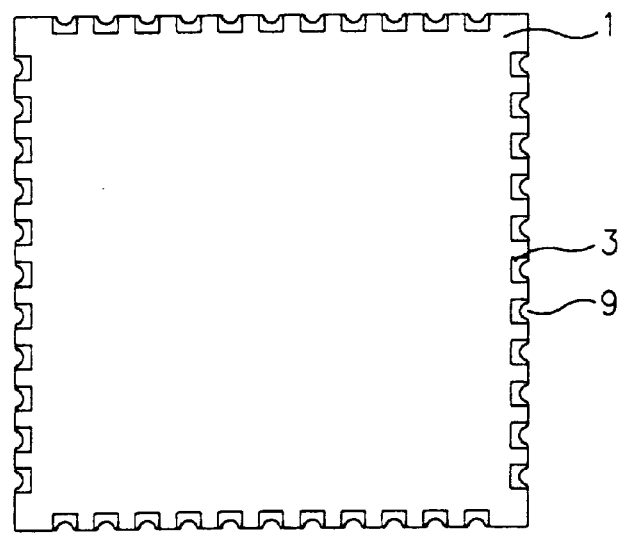
Figure 2:
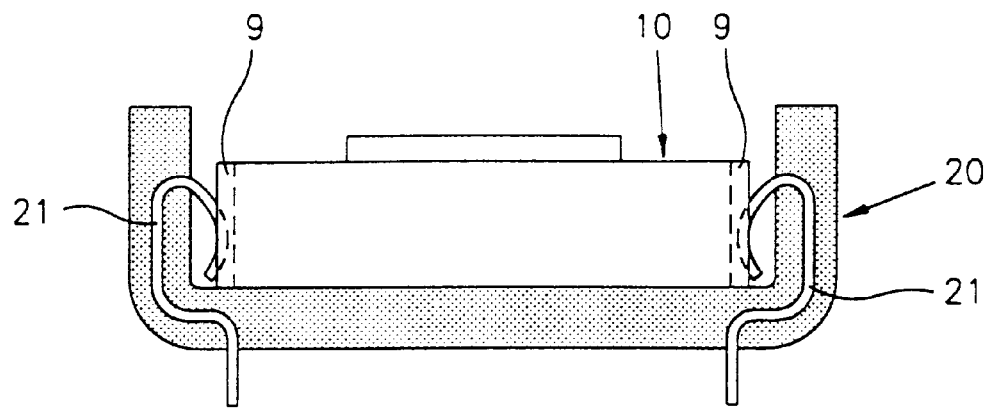
FIG. 2 is a partial cross-sectional view illustrating the CLCC semiconductor package of FIGS. 1A and 1B mounted in a related art socket.
Figure 3:
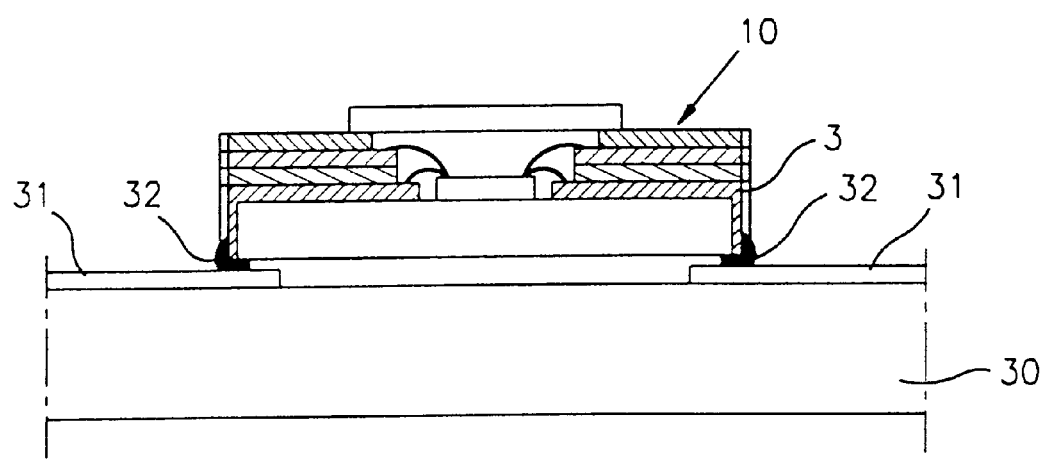
FIG. 3 is a partial cross-sectional view illustrating the CLCC semiconductor package of FIGS. 1A and 1B mounted on a printed circuit board (PCB)

In addition, since the socket shown in FIG. 5 has second socket pins 53 which are of similar construction to the socket pins 21 shown in FIG. 2, a related art semiconductor package may also be mounted in a socket according to the present invention.

Figure 7:
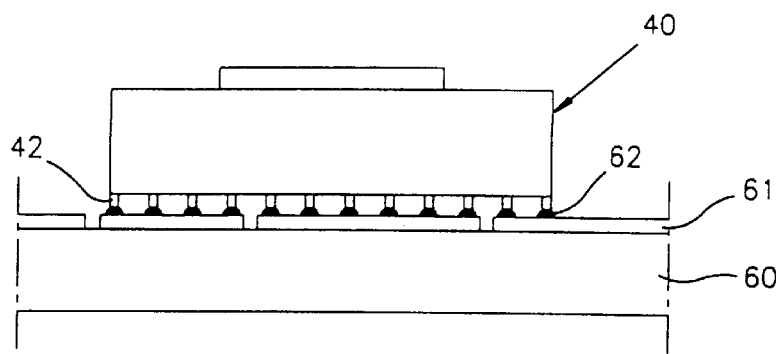
FIG. 7 is a side view illustrating the semiconductor package of FIG. 4 mounted on a PCB according to the present invention.

FIG. 7 is a side view illustrating the semiconductor package of FIG. 4 mounted on a PCB according to the present invention. As shown therein, the plurality of metallic leads 42 formed on the lower surface of the semiconductor package 40 are soldered to a circuit pattern of a PCB 60. In the drawings, reference numerals 62 denote solder.

As described above, a semiconductor package and socket embodying the present invention are directed to arranging a multiple pin structure within a limited space, to achieve a compact product with a large number of pins. In addition, it is possible to use a semiconductor socket assembly embodying the present invention with a related art CLCC semiconductor package. Moreover, it is possible to achieve a more accurate electrical coupling between the socket and the semiconductor package and to achieve excellent heat radiating characteristics.

The foregoing embodiments are merely exemplary and are not to be construed as limiting the present invention. The present teaching can be readily applied to other types of apparatus. The description of the present invention is intended to be illustrative, and not to limit the scope of the claims. Many alternatives, modifications, and variations will be apparent to those skilled in the art.

What is claimed is:

1. A socket for a semiconductor package, comprising:
   a socket body;
   a recess formed in an upper central portion of the socket body for receiving the semiconductor package;
   a plurality of first socket pins that pass through a bottom portion of the body, wherein upper and lower ends of said first socket pins extend beyond upper and lower surfaces, respectively, of the bottom portion of the socket body;
   a plurality of second socket pins that pass through lateral walls of the socket body, wherein upper ends of said second socket pins extend into an interior of the recess, and wherein lower ends of said second socket pins extend beyond the lower surface of the socket body.

2. The socket of claim 1, further comprising a socket cover for covering the recess.

3. The socket of claim 1, wherein the upper ends of said first and second socket pins are elliptically bent.

4. The socket of claim 1, wherein the upper ends of the first plurality of socket pins are engageable with leads formed on a bottom surface of a semiconductor package when the semiconductor package is mounted in the recess.

5. The socket of claim 1, wherein the upper ends of the second socket pins are engageable with electrical contacts formed on peripheral walls of a semiconductor package when the semiconductor package is mounted in the recess.

6. The socket of claim 2, wherein an upper surface of the socket cover comprises a plurality of fins.

7. The socket of claim 2, wherein one side of the socket cover is hinged to the socket body.

8. The socket of claim 2, wherein said socket cover includes a hook formed therein.

9. The socket of claim 8, wherein said socket body includes a hook recess that is engageable with the hook to hold the socket cover closed.

10. A semiconductor package, comprising:

a monolithic ceramic base layer;

a plurality of conductive leads that pass through the base layer and that extend a substantial distance below a bottom surface of the base layer;

a wiring layer formed in the base layer and below an upper surface of the base layer, the wiring layer comprising a plurality of conductive paths that are electrically coupled to respective ones of the plurality of conductive leads;

a recess formed in a central portion of the wiring layer;

a semiconductor chip mounted on a bottom portion of the recess;

conductive wires for electrically coupling the semiconductor chip to the plurality of conductive paths of the wiring layer;

a socket body having a recess configured to receive the ceramic base layer;

a plurality of first socket pins that pass through a bottom portion of the body, wherein upper and lower ends of the first socket pins extend beyond upper and lower surfaces, respectively, of the bottom portion of the socket body; and a plurality of second socket pins that pass through lateral walls of the body, wherein upper ends of the second socket pins extend into an interior of the recess, and wherein lower ends of the second socket pins extend beyond the lower surface of the socket body.

11. The semiconductor package of claim 10, further comprising a socket cover for covering the recess.

12. The semiconductor package of claim 10, wherein the upper ends of the second socket pins are elliptically bent.

13. The semiconductor package of claim 10, wherein the upper ends of the first socket pins are elliptically bent.

* * * * *